United States Patent
Oka

(10) Patent No.: US 6,870,202 B2
(45) Date of Patent: Mar. 22, 2005

(54) SURGE PROTECTION SEMICONDUCTOR DEVICE

(75) Inventor: Ritsuo Oka, Hanno (JP)

(73) Assignee: Shindengen Electric Manufacturing Co., Ltd., Tokyo (JP)

(*) Notice: Subject to any disclaimer, the term of this patent is extended or adjusted under 35 U.S.C. 154(b) by 0 days.

(21) Appl. No.: 10/835,062

(22) Filed: Apr. 30, 2004

(65) Prior Publication Data

US 2004/0201035 A1 Oct. 14, 2004

Related U.S. Application Data

(63) Continuation of application No. PCT/JP02/11578, filed on Nov. 6, 2002.

(30) Foreign Application Priority Data

Nov. 7, 2001 (JP) ........................... 2001-342236

(51) Int. Cl.[7] .............................................. H01L 29/74
(52) U.S. Cl. ...................... 257/173; 257/162; 257/546; 257/122; 257/107; 257/109; 257/126; 257/110; 257/120; 257/355; 361/91.5; 361/91.8; 361/118
(58) Field of Search ................................ 257/173, 546, 257/162, 122, 107, 109, 126, 110, 120, 355; 361/118, 91.8, 91.5

(56) References Cited

U.S. PATENT DOCUMENTS

| | | | |
|---|---|---|---|
| 4,644,437 A | 2/1987 | Robe | |
| 5,243,488 A | 9/1993 | Bernier et al. | |
| 5,369,291 A | * 11/1994 | Swanson | 257/130 |
| 5,512,784 A | 4/1996 | Fried et al. | |
| 5,696,391 A | * 12/1997 | Bernier | 257/146 |
| 5,895,940 A | * 4/1999 | Kim | 257/173 |
| 6,017,778 A | 1/2000 | Pezzani | |
| 6,075,277 A | 6/2000 | Pezzani | |
| 6,104,591 A | 8/2000 | Casey et al. | |
| 6,479,841 B1 | * 11/2002 | Simonnet | 257/146 |
| 6,583,496 B2 | * 6/2003 | Galtie et al. | 257/601 |

FOREIGN PATENT DOCUMENTS

| | | |
|---|---|---|
| JP | 46-43937 | 12/1971 |
| JP | 5-36979 | 2/1993 |
| JP | 9-7729 | 1/1997 |

* cited by examiner

*Primary Examiner*—Tom Thomas
*Assistant Examiner*—Eugene Lee
(74) *Attorney, Agent, or Firm*—Bacon & Thomas, PLLC

(57) ABSTRACT

A pnpn thyristor element Thy1 and six pn diode elements D1, D2, D3, D4, D5, and D6 are formed in a semiconductor substrate of a first conductivity type, and separated into six regions by a diffusion layer of a second conductivity type which also functions as the anode of the thyristor element Thy1. A double isolation diffusion layer is disposed between the region of the thyristor element Thy1 and three pn diode elements D1 ·D2 and D6, and the region of the three remaining pn diodes D3, D4, and D5. Surface connection is performed to provide a balance type surge protection circuit.

7 Claims, 5 Drawing Sheets

SURGE PROTECTION SEMICONDUCTOR DEVICE

CROSS-REFERENCE TO RELATED APPLICATIONS

This is a Continuation Application of PCT Application No. PCT/JP02/11578, filed Nov. 6, 2002, which was not published under PCT Article 21(2) in English.

This application is based upon and claims the benefit of priority from prior Japanese Patent Application No. 2001-342236, filed Nov. 7, 2001, the entire contents of which are incorporated herein by reference.

BACKGROUND OF THE INVENTION

1. Field of the Invention

The present invention relates to a semiconductor surge protection device for protecting circuit systems in communication apparatuses, computers, and the like from an overvoltage and overcurrent such as lightning surge and switching surge.

2. Description of the Related Art

Surge protection devices of this type have been achieved by combining pnpn thyristor elements and pn diode elements on a substrate to provide a desired circuit. These techniques are disclosed in U.S. Pat. Nos. 6,104,591, 5,512,784, and 4,644,437.

In a surge protection device having the above arrangement, however, a plurality of parts, i.e., pnpn surge protection elements and pn diode elements are mounted on a substrate. This complicates the mounting process, increases the product size, and makes the product expensive.

Also, the conventional technique comprising a monolithic structure of pnpn thyristor elements and pn diode elements is disclosed in U.S. Pat. No. 6,075,277.

Unfortunately, this technique is applicable only to a circuit configuration, as shown in FIG. 5, in which a pnpn thyristor element Thy4 is inserted between AC terminals of a diode bridge. That is, the technique cannot be applied to a circuit in which the pnpn thyristor Thy4 is inserted between DC terminals of a diode bridge.

Therefore, it is an object of the present invention to provide a monolithic surge protection semiconductor device in which a balance circuit is formed in the same semiconductor substrate.

It is another object of the present invention to provide a surge protection semiconductor device in which diodes are isolated by a double isolation region.

It is a further another object of the present invention to provide a compact, long-life surge protection semiconductor device.

BRIEF SUMMARY OF THE INVENTION

A surge protection semiconductor device comprises a semiconductor substrate of a first conductivity type having first and second surfaces; a thyristor element, provided in a first semiconductor region of a second conductivity type formed in the semiconductor substrate so as to extend from the first surface to the second surface, having an anode electrode and cathode electrode; a substrate region of the first conductivity type, the substrate region being adjacent to one side of the first semiconductor region and being comprised of the semiconductor substrate; first and second diode elements provided in a second semiconductor region of the first conductivity type, the second semiconductor region being adjacent to the other side of the first semiconductor region and being comprised of the semiconductor substrate, each of the first and second diode elements having an anode electrode and a common cathode electrode; third, fourth and fifth diode elements each being provided in third, fourth and fifth semiconductor regions, respectively, the third, fourth and fifth semiconductor regions being comprised of the semiconductor substrate and being isolated from each other by one of isolation regions of the second conductivity type, one of the isolation regions being adjacent to the substrate region, and each of the third, fourth and fifth diode elements having an anode electrode and cathode electrode formed on the first surface; and a sixth diode element provided in a sixth semiconductor region of the first conductivity type adjacent to the second substrate region and isolated by one of the isolation regions, the sixth semiconductor region being comprised of the semiconductor substrate, the sixth diode element having an anode electrode and cathode electrode.

DETAILED DESCRIPTION OF THE INVENTION

Figure 1:
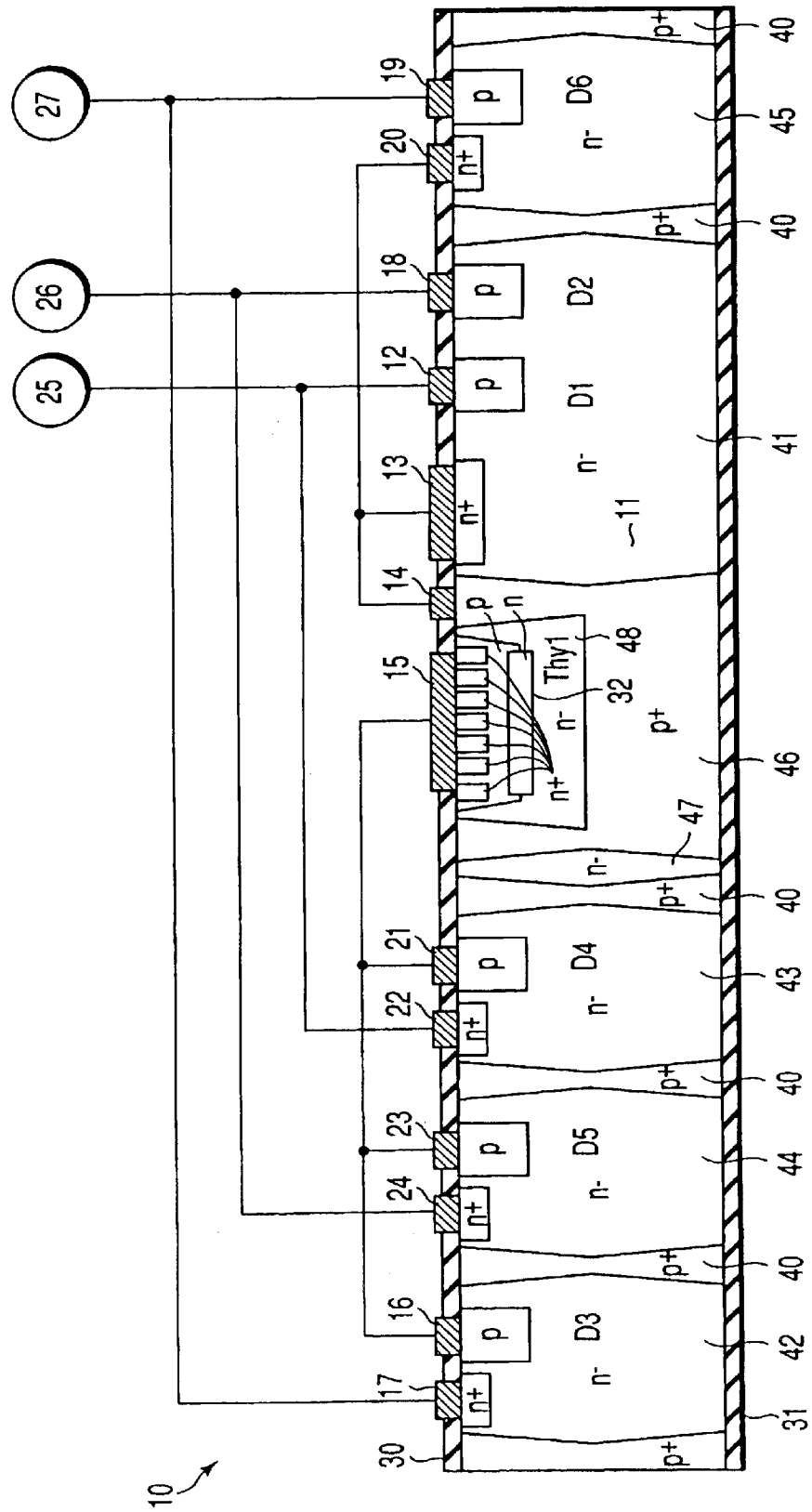
FIG. 1 is a sectional view showing a surge protection semiconductor device according to the first embodiment of the present invention.
Figure 2:
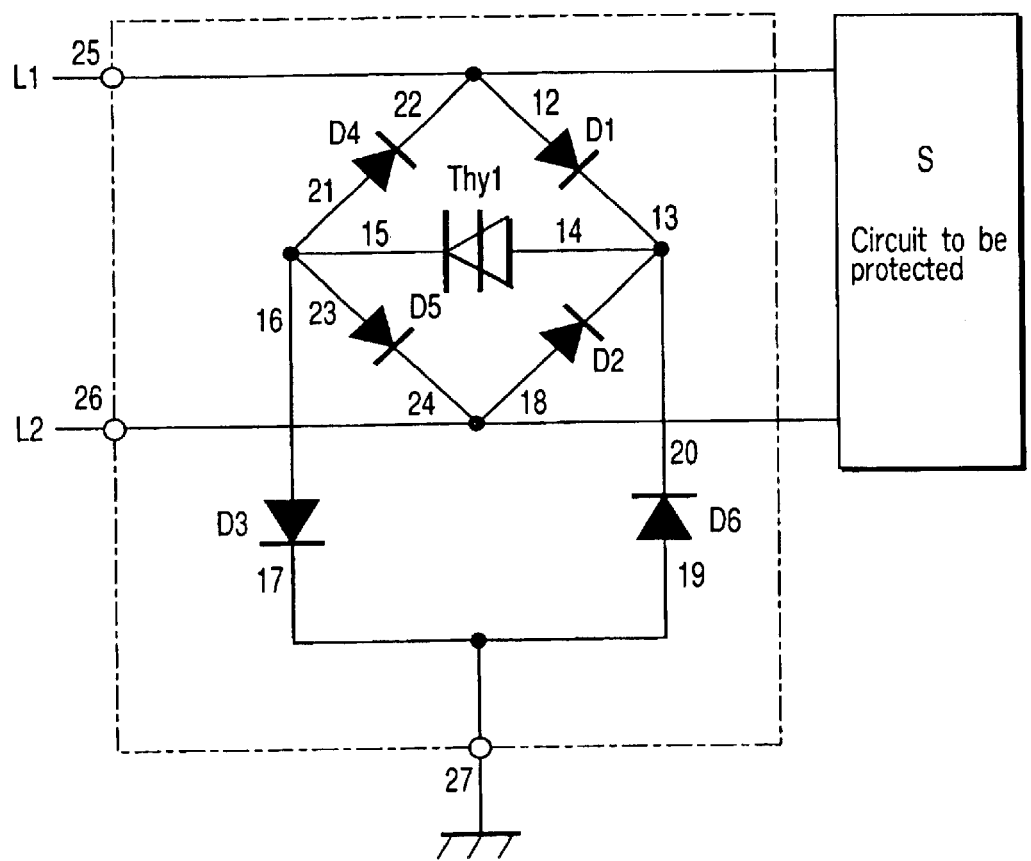
FIG. 2 is a view for explaining a circuit to be used which includes an equivalent circuit (enclosed with the alternate long and short dashed lines) of the surge protection semiconductor device according to the present invention.

FIG. 1 is a sectional view showing a surge protecting semiconductor device 10 according to the first embodiment, and FIG. 2 is a circuit used including its equivalent circuit (enclosed with the alternate long and short dashed lines).

That is, $p^+$-type isolation regions 40 are formed by selectively diffusing a p-type impurity from the two surfaces of an $n^-$-type semiconductor substrate 11 having first and second surfaces. The $n^-$-type semiconductor substrate 11 is separated into a plurality of element regions by the isolation regions 40. That is, a plurality of element regions 41 to 45, which are the $n^-$-type semiconductor substrate and extend from the first surface to the second surface, and a $p^+$-type anode region 46 of a thyristor element Thy1 are provided. An isolation region 47 made of the $n^-$-type semiconductor substrate is interposed between the $p^+$-type anode region 46 and $n^-$-type element region 43, thereby doubly isolating the $n^-$-type element region 41 and the $n^-$-type element region 43 by the $p^+$-type anode region 46, $n^-$-type isolation region 47, and $p^+$-type region 40. More specifically, the $p^+$-type anode region 46 of the thyristor element Thy1 functions as a $p^+$-type isolation region.

Also, the aforementioned p-type impurity diffusion for forming the anode region 46 of the thyristor element Thy1 is so performed that a region 48 made of the $n^-$-type semiconductor substrate remains. In the region 48, an n-type buried layer 32 having an impurity concentration higher than that of the semiconductor substrate is produced. After a p-type region is formed, a plurality of n$^+$-type emitter layers are provided.

For each of the element regions 41 to 45, anode and cathode regions are formed by diffusing p- and n-type impurities from the first surface. Lateral diode elements D1 to D6 are provided by forming electrodes in these anode and cathode regions. In addition, the thyristor element Thy1 is provided by forming an electrode on the n$^+$-type emitter layers and the anode region 46 respectively.

In FIG. 1, reference numeral 10 denotes a semiconductor chip; 12, 13, 14, 15, 16, 17, 18, 19, 20, 21, 22, 23, an 24, a metal electrode; 25, 26, and 27, a metal electrode terminal; and 30 and 31, an insulating film such as silicon oxide or the like. A portion between the metal electrodes 14 and 15 indicates the pnpn thyristor element Thy1 having a buried diffusion layer 32. The buried diffusion layer 32 has the same conductivity type as that of the semiconductor substrate, and has an impurity concentration slightly higher than the substrate concentration.

Portions between the metal electrodes 12 and 13, 18 and 13, 21 and 22, 23 and 24, 16 and 17, and 19 and 20 provide the first to sixth pn diode elements D1, D2, D3, D4, D5, and D6, respectively.

The connection on the semiconductor surface using wiring layers are as follows. The anode metal electrode 12 of the first pn diode element D1 and the cathode metal electrode 22 of the fourth pn diode element D4 are connected to the first metal electrode terminal 25, the anode metal electrode 18 of the second pn diode element D2 and the cathode metal electrode 24 of the fifth pn diode element D5 are connected to the second metal electrode terminal 26, the anode metal electrode 19 of the sixth pn diode element D6 and the cathode metal electrode 17 of the third pn diode element D3 are connected to the third metal electrode terminal 27, the cathode metal electrodes 13 and 20 of the first, second, and sixth pn diode elements D1, D2, and D6 are connected to the anode metal 14 of the thyristor element Thy1, and the anode metal electrodes 16, 21, and 23 of the third, fourth, and fifth diode elements D3, D4, and D5 are connected to the cathode metal terminal 15 of the thyristor element Thy1. In this manner, a monolithic surge protection semiconductor device in which the balanced surge protection circuit is formed on a single substrate is obtained.

As described above, the isolation region 47 made of the n$^-$-type semiconductor substrate is interposed between the n$^-$-type element region 41 and 43, thereby doubly isolating the n$^-$-type element region 41 and 43 by the p$^+$-type anode region 46, n$^-$-type isolation region 47, and p$^+$-type isolation region 40. This increases the breakdown voltage between the diode elements D1 and D4, and improves the reliability of the diode bridge.

Also, in this embodiment, the metal electrodes of the thyristor Thy1 and diode elements D1 to D6 are arranged on the first surface of the semiconductor substrate. This facilitates a wiring process during mounting.

Furthermore, as described above, a region A including the thyristor Thy1 and diode elements D1, D2, and D6 and a region B including the diode elements D3, D4, and D5 are doubly isolated. Although the positions of these elements can be changed in each of the regions A and B, the positions of the elements cannot be changed between the regions A and B.

FIG. 2 is a view for explaining a circuit to be used which includes an equivalent circuit (enclosed with the dashed line) of the surge protection semiconductor device according to the present invention.

Lines L1 and L2 indicate signal lines, and S indicates a circuit to be protected, such as a communication apparatus. A portion enclosed with the dashed line indicates the equivalent circuit of the surge protection semiconductor device according to the present invention. The metal electrode terminal 25 is connected to L1, the metal electrode terminal 26 is connected to L2, and the metal electrode terminal 27 is connected to a ground line.

When a normal signal-line-to-ground voltage is applied to the signal lines L1 and L2, i.e., when a voltage is applied between the metal electrode terminals 25 and 27 and between the metal electrode terminals 26 and 27, the thyristor element Thy1 shown in FIG. 1 is kept at an off-state. However, if an overvoltage or overcurrent, such as a lightning surge which enters L1 and L2 in-phase, is generated, the voltage is clamped and the overcurrent is grounded via the thyristor element Thy1 regardless of whether the surge invades L1 or L2, thus the circuit S to be protected is protected from the overvoltage and overcurrent surge.

That is, the protection element portion indicated by the dashed line is normally kept at the off-state because the applied voltage value is smaller than the breakdown voltage value of Thy1, and a communication signal electric current flows to the circuit S to be protected.

When a positive-polarity surge invades from the signal lines L1 and L2, Thy1 is turned on by the surge voltage, and the surge current is:

(1) grounded through a path of 25→D1→Thy1→D3→27→GND if the surge invades from L1, and (2) grounded by through a path of 26→D2→Thy1→D3→27→GND if the surface invades from L2.

Opposite-polarity surge is:

(3) grounded through a path of 25→D4→Thy1→D6→27→GND if the surge invades from L1, and (4) grounded through a path of 26→D5→Thy1→D6→27→GND if the surge invades from L2.

Figure 3:
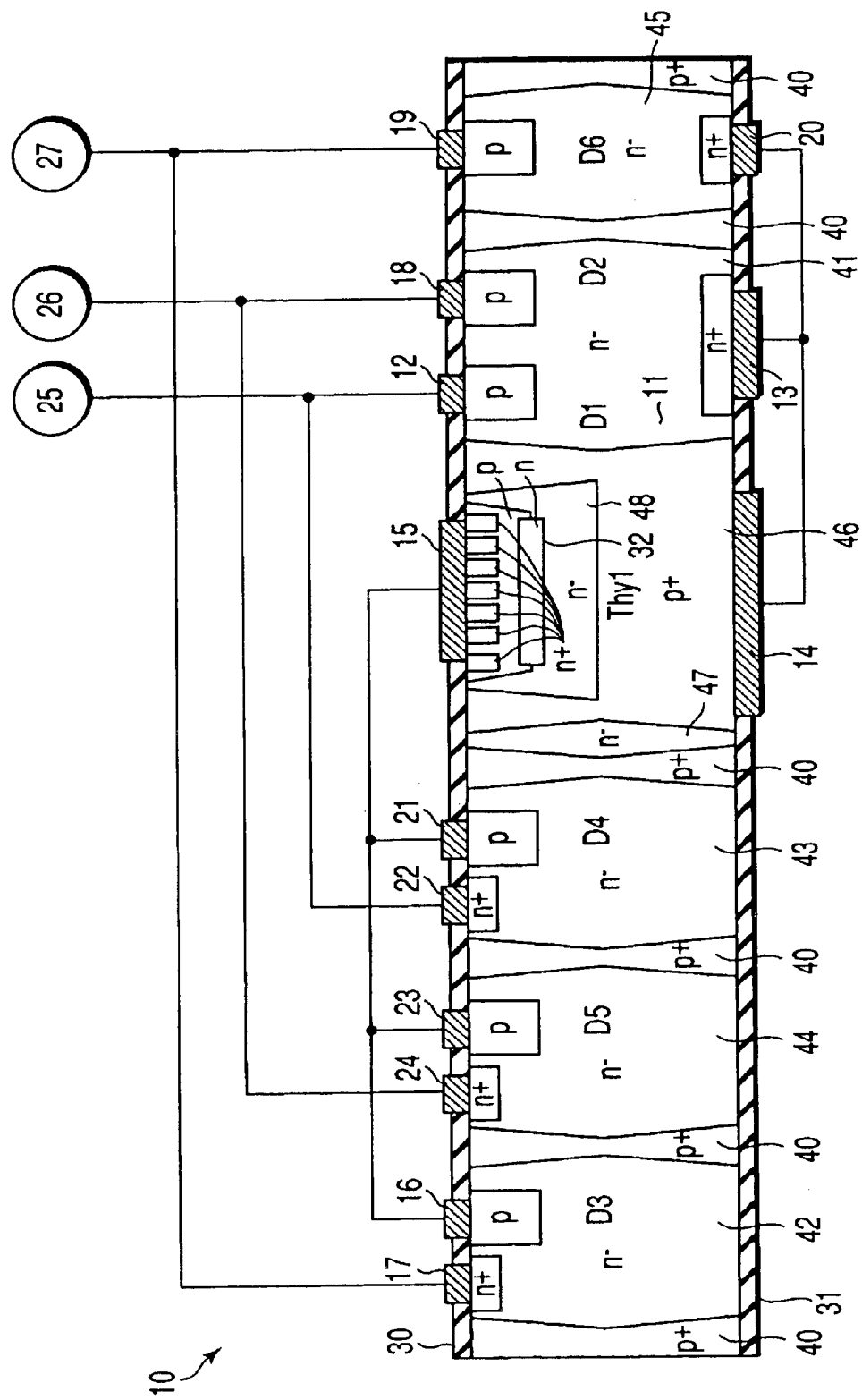
FIG. 3 is a sectional view showing a surge protection semiconductor device according to the second embodiment of the present invention.

FIG. 3 is a sectional view showing a surge protection semiconductor device according to the second embodiment of the present invention. In FIG. 3, the same reference numerals as in FIG. 1 denote the same parts.

A thyristor element Thy1 and first, second, and sixth diode elements D1, D2, and D6 are provided as a vertical element structure in consideration of the surge withstand voltage and the like. The remainder of the structure is the same as in FIG. 1.

In this structure, it is also possible to omit the isolation region 40 between an element region 41 forming the diode elements D1 and D2 and an element region 45 forming D6.

In this embodiment, the thyristor element Thy1 and first, second, and sixth diode elements D1, D2, and D6 are provided as the vertical element structure, thus obtaining a surge protection semiconductor device having an increased surge withstand voltage.

Figure 4:
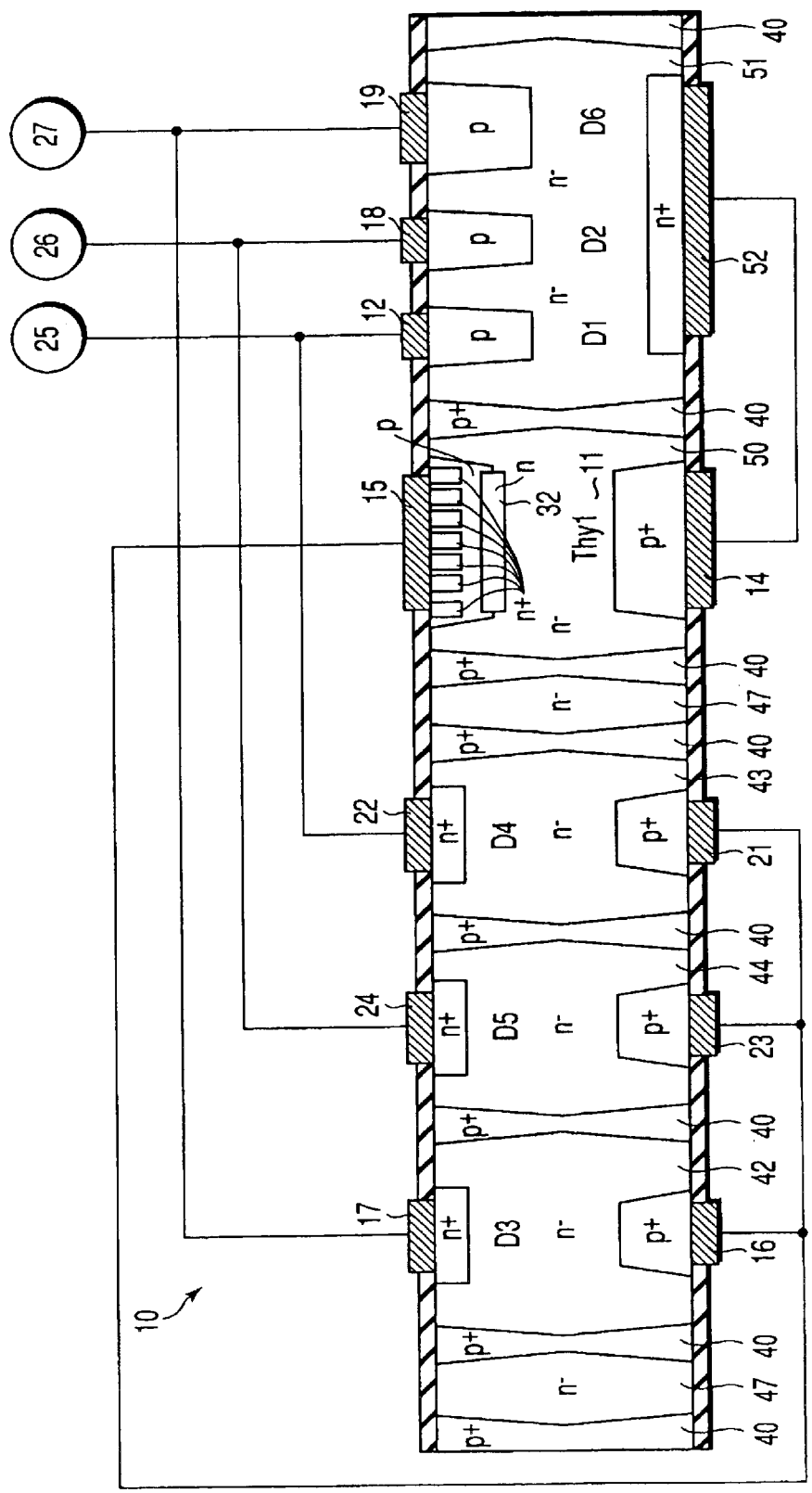
FIG. 4 is a sectional view showing a surge protection semiconductor device according to the third embodiment of the present invention.
Figure 5:
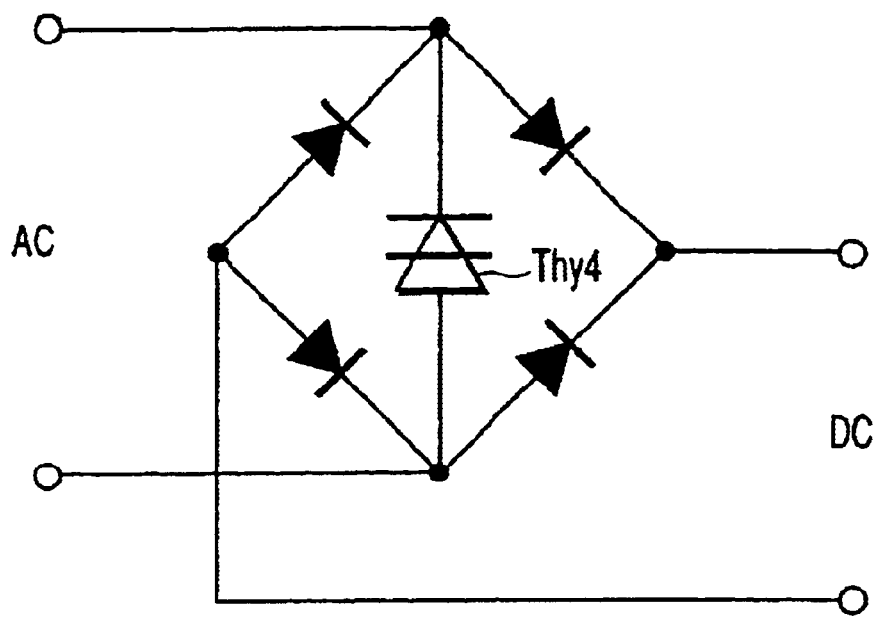
FIG. 5 is a view for explaining the circuit of a surge protection semiconductor device according to the conventional technique.

FIG. 4 is a sectional view showing a surge protection semiconductor device according to the third embodiment of the present invention. In FIG. 4, the same reference numerals as in FIG. 1 denote the same parts.

A thyristor element Thy1 and first to sixth diode elements D1 to D6 are provided as a vertical element structure in consideration of the surge withstand voltage and the like. In this structure, an n$^-$-type semiconductor substrate 11 is separated by a p$^+$-type isolation region 40 to provide an n$^-$-type element region 50 for forming the thyristor element Thy1 and an n$^-$-type element region 51 for forming the first, second, and sixth diode elements D1, D2, and D6.

The element region 50 includes an anode region formed from the second surface, an n-type buried layer 32 formed from the first surface and having an impurity concentration higher than that of the semiconductor substrate, a p-type base region, and a plurality of n⁺-type emitter layers.

The element region 51 includes anode regions of the first, second, and sixth diode elements D1, D2, and D6 formed from the first surface, and a common cathode region formed from the second surface.

A common cathode electrode 52 formed in the common cathode region is connected to an anode electrode 14 of the thyristor element Thy1, thereby providing a diode bridge shown in FIG. 2 as in the above embodiments. The rest is the same as in FIG. 1.

As described above, the isolation region 47 made of the n⁻-type semiconductor substrate is interposed between the n⁻-type element region 50 and the n⁻-type element region 43, thereby doubly isolating the n⁻-type element region 50 and n⁻-type element region 43 by the p⁺-type isolation region 40, the n⁻-type isolation region 47, and the p⁺-type isolation region 40. This increases the breakdown voltage between the thyristor element Thy1 and diode element D4, and improves the reliability of the diode bridge.

Note that as a method of setting the forward breakdown voltage of the thyristor element Thy1 lower than the breakdown voltage of the first to sixth diode elements D1, D2, D3, D4, D5, and D6, a method of making the p-type base diffusion depth of the thyristor element smaller than the p-type anode diffusion depth of the diode elements may also be used instead of the method using the buried-structure thyristor element Thy1 having the buried diffusion layer 32 as described above.

Note also that as an application example of primary protection for the communication line, the breakdown voltage of the thyristor Thy1 must be, e.g., 230 V, 290 V, 310 V, or 350 V, although this voltage is determined by the buried layer 32, and the diode withstand voltage must be higher than that, e.g., 800 V.

The thyristor element Thy1 and diode elements D1, D2, D3, D4, D5, and D6 are formed into a monolithic structure on the same semiconductor chip, and the diode elements D1 and D4 are isolated by a double isolation structure. Accordingly, a compact surge protection semiconductor device having a high breakdown voltage and high reliability can be obtained.

What is claimed is:

1. A surge protection semiconductor device comprising:
    a semiconductor substrate of a first conductivity type having first and second surfaces;
    a thyristor element, provided in a first semiconductor region of a second conductivity type formed in the semiconductor substrate so as to extend from the first surface to the second surface, having an anode electrode and cathode electrode;
    a substrate region of the first conductivity type, the substrate region being adjacent to one side of the first semiconductor region and being comprised of the semiconductor substrate;
    first and second diode elements provided in a second semiconductor region of the first conductivity type, the second semiconductor region being adjacent to the other side of the first semiconductor region and being comprised of the semiconductor substrate, each of the first and second diode elements having an anode electrode and a common cathode electrode;
    third, fourth and fifth diode elements each being provided in third, fourth and fifth semiconductor regions, respectively, the third, fourth and fifth semiconductor regions being comprised of the semiconductor substrate and being isolated from each other by one of isolation regions of the second conductivity type, one of the isolation regions being adjacent to the substrate region, and each of the third, fourth and fifth diode elements having an anode electrode and cathode electrode formed on the first surface; and
    a sixth diode element provided in a sixth semiconductor region of the first conductivity type adjacent to the second semiconductor region and isolated by one of the isolation regions, the sixth semiconductor region being comprised of the semiconductor substrate, the sixth diode element having an anode electrode and cathode electrode.

2. The surge protection semiconductor device according to claim 1, wherein the second surface is covered with an insulating film.

3. The surge protection semiconductor device according to claim 1, wherein each of the thyristor element and first to sixth diode elements has a lateral structure in which the anode and cathode electrodes are provided on the first surface.

4. The surge protection semiconductor device according to claim 3, wherein first and second electrode terminals are respectively connected to a third node, given by the anode electrode of the first diode element and the cathode electrode of the fourth diode element, and a fourth node, given by the anode electrode of the second diode element and the cathode electrode of the fifth diode element, respectively, and also connected to a circuit to be protected.

5. The surge protection semiconductor device according to claim 1, wherein at least the first, second and sixth diode elements have a vertical structure in which the anode electrodes are provided on the first surface, and the cathode electrodes are provided on the second surface, and the thyristor element has a vertical structure in which the cathode electrode is provided on the first surface, and the anode electrode is provided on the second surface.

6. The surge protection semiconductor device according to claim 1, wherein the anode electrode of the first diode element and the cathode electrode of the fourth diode element are connected, the cathode electrode of the first diode element and the cathode electrode of the second diode element are connected, the anode electrode of the second diode element and the cathode electrode of the fifth diode element are connected, the anode electrode of the fifth diode element and the anode electrode of the fourth diode element are connected, the thyristor element is connected between a first node, given by the cathode electrode of the first diode element and the cathode electrode of the second diode element, and a second node, given by the anode electrode of the fifth diode element and the anode electrode of the fourth diode element such that the first node is positive with respect to the second node, the cathode electrode of the sixth diode element is connected to the first node, the anode electrode of the third diode element is connected to the second node, and the anode electrode of the sixth diode element and the cathode electrode of the third diode element are connected to a ground terminal.

7. A surge protection semiconductor device according to claim 1, wherein a forward breakdown voltage of the thyristor element is set lower than a breakdown voltage of the first to sixth diode elements.

* * * * *